United States Patent
Kwon et al.

(10) Patent No.: US 8,787,100 B2
(45) Date of Patent: Jul. 22, 2014

(54) NON-VOLATILE MEMORY DEVICE GENERATING A RESET PULSE BASED ON A SET PULSE, AND METHOD OF OPERATING THE SAME

(71) Applicants: Yong Jin Kwon, Suwon-si (KR); Kwang Jin Lee, Hwaseong-si (KR); Hye-Jin Kim, Seoul (KR)

(72) Inventors: Yong Jin Kwon, Suwon-si (KR); Kwang Jin Lee, Hwaseong-si (KR); Hye-Jin Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 13 days.

(21) Appl. No.: 13/710,504

(22) Filed: Dec. 11, 2012

(65) Prior Publication Data
US 2013/0265837 A1 Oct. 10, 2013

(30) Foreign Application Priority Data
Apr. 10, 2012 (KR) ........................ 10-2012-0037466

(51) Int. Cl.
*G11C 7/00* (2006.01)
*G11C 29/02* (2006.01)
*G11C 13/00* (2006.01)
*G11C 7/22* (2006.01)

(52) U.S. Cl.
CPC ................ *G11C 7/22* (2013.01); *G11C 29/021* (2013.01); *G11C 29/028* (2013.01); *G11C 29/023* (2013.01); *G11C 13/0061* (2013.01); *G11C 2013/0088* (2013.01); *G11C 13/00* (2013.01); *G11C 13/0069* (2013.01); *G11C 13/0004* (2013.01)
USPC ...................... 365/194; 365/230.06

(58) Field of Classification Search
CPC .................................... G11C 7/22; G11C 8/08
USPC ................................ 365/194, 230.06
See application file for complete search history.

(56) References Cited

U.S. PATENT DOCUMENTS

| | | | |
|---|---|---|---|
| 7,130,227 B2* | 10/2006 | Nobunaga et al. | 365/194 |
| 7,317,343 B1* | 1/2008 | De La Cruz et al. | 327/295 |
| 7,580,278 B2 | 8/2009 | Cho et al. | |
| 7,911,824 B2 | 3/2011 | Kawai et al. | |
| 7,929,337 B2 | 4/2011 | Choi et al. | |
| 8,102,704 B2 | 1/2012 | Lee et al. | |
| 8,269,531 B1* | 9/2012 | Wright | 327/143 |
| 2005/0278592 A1* | 12/2005 | Yamada et al. | 714/721 |
| 2005/0286338 A1* | 12/2005 | Nobunaga et al. | 365/233 |
| 2007/0147146 A1* | 6/2007 | Yamada et al. | 365/200 |
| 2008/0266933 A1* | 10/2008 | Chen et al. | 365/148 |
| 2009/0001348 A1* | 1/2009 | Kaeriyama et al. | 257/4 |
| 2011/0026318 A1 | 2/2011 | Franceschini et al. | |
| 2011/0110170 A1* | 5/2011 | Tran et al. | 365/189.15 |

* cited by examiner

*Primary Examiner* — Michael Tran
(74) *Attorney, Agent, or Firm* — Volentine & Whitt, PLLC

(57) ABSTRACT

A non-volatile memory device includes a set pulse generator configured to generate a set pulse, a reset pulse generator configured to generate a reset pulse based on the set pulse, and a write driver block configured to write second data to a second non-volatile memory cell using the reset pulse, while writing first data to a first non-volatile memory cell using the set pulse.

12 Claims, 20 Drawing Sheets

FIG. 9
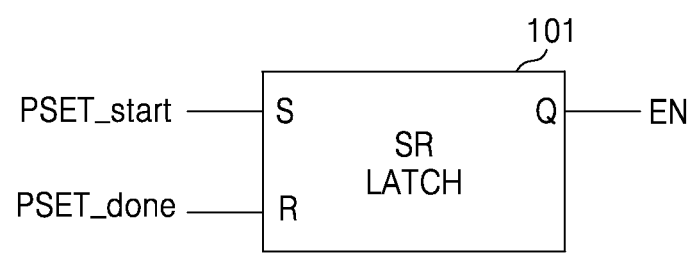
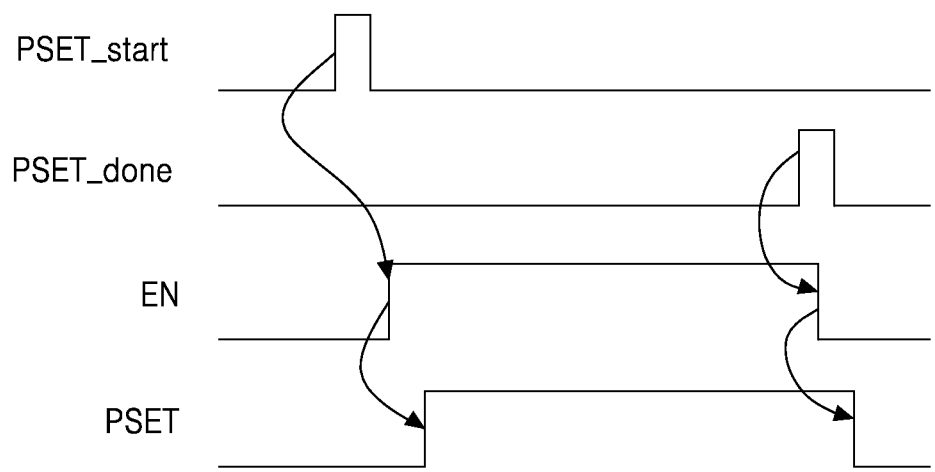

NON-VOLATILE MEMORY DEVICE GENERATING A RESET PULSE BASED ON A SET PULSE, AND METHOD OF OPERATING THE SAME

CROSS-REFERENCE TO RELATED APPLICATIONS

A claim for priority under 35 U.S.C. §119 is made to Korean Patent Application No. 10-2012-0037466 filed on Apr. 10, 2012, in the Korean Intellectual Property Office, the entire contents of which are hereby incorporated by reference.

BACKGROUND

Exemplary embodiments relate to semiconductor circuits, and more particularly, to a non-volatile memory device, capable of generating a reset pulse based on a set pulse during a set data/reset data simultaneous-program operation, a method of operating the non-volatile memory device, and an electronic device including the non-volatile memory device.

A chalcogenide alloy is used as a phase-change material of a phase-change random-access memory (PRAM). The phase-change material changes from a crystalline state (low electrical resistance) to an amorphous state (high electrical resistance) and vice versa due to Joule heating caused by current or voltage supplied to the phase-change material. Accordingly, the PRAM stores data using resistance differences due to the phase change in the phase change material.

Conventional PRAM does not support an operation of simultaneously programming set data and reset data to different memory cells. Moreover, when conventional PRAM performs a read operation during a write operation, namely, performs a read-while-write (RWW) operation, if noise is generated on a read path by a signal on a write path, read data may be damaged by the noise, causing an error in the RWW operation.

SUMMARY

According to an aspect of the present invention, there is provided a method of operating a non-volatile memory device. The method includes generating a set pulse, and generating a reset pulse based on the set pulse after programmed delay. The programmed delay may be determined based on information set in a programmable memory. The programmed delay is determined based on whether each fuse of the programmable memory is cut.

The reset pulse may be generated when the set pulse is activated. The reset pulse may be generated when the set pulse is deactivated. The reset pulse may be generated such that the reset pulse is deactivated when the set pulse is deactivated. The reset pulse may be generated such that a duration of the reset pulse exists within a duration of the set pulse.

The set pulse may include multiple pulses having overlapping durations, and the reset pulse may be generated based on one pulse of the multiple pulses. The method may further include selecting and outputting the one pulse of the multiple pulses in response to selection signals corresponding to the programmed delay.

The method may further substantially simultaneously programming second data to a second non-volatile memory cell using the reset pulse and first data to a first non-volatile memory cell using the set pulse. The method may further include writing second data corresponding to the reset pulse to a second non-volatile memory cell using a second switching circuit that operates in response to a switching signal, while writing first data corresponding to the set pulse to a first non-volatile memory cell using a first switching circuit that operates in response to the switching signal. The switching signal may be deactivated in response to deactivation of one of the set pulse and the reset pulse.

According to another aspect of the present invention, there is provided a non-volatile memory device that includes a set pulse generator configured to generate a set pulse, a reset pulse generator configured to generate a reset pulse based on the set pulse, and a write driver block configured to write second data to a second non-volatile memory cell using the reset pulse, while writing first data to a first non-volatile memory cell using the set pulse.

The set pulse generator may sequentially generate multiple pulses that constitute the set pulse, and the reset pulse generator may generate the reset pulse in response to one pulse of the multiple. The non-volatile memory device may further include a selector configured to select and output the one pulse of the multiple pulses in response to selection signals.

The non-volatile memory device may further include a memory configured to store information about the selection signals. The memory may include a mode register set (MRS) or a one-time programmable (OTP) memory, for example.

The non-volatile memory device may further include a delay adjustment circuit configured to adjust a delay of the set pulse. The reset pulse generator may generate the reset pulse based on a delay-adjusted set pulse. The reset pulse generator may generate the reset pulse in response to activation of the set pulse. The reset pulse generator may generate the reset pulse in response to deactivation of the set pulse. The reset pulse generator may generate the reset pulse which is deactivated, in response to deactivation of the set pulse.

The non-volatile memory device may further include a switching circuit configured to simultaneously block a connection between the first non-volatile memory cell and the write driver block and a connection between the second non-volatile memory cell and the write driver block in response to deactivation of one of the set pulse and the reset pulse.

According to another aspect of the present invention, there is provided an electronic device the includes a non-volatile memory device and a controller configured to control operations of the non-volatile memory device. The non-volatile memory device includes a set pulse generator configured to generate a set pulse, a reset pulse generator configured to generate a reset pulse based on the set pulse, and a write driver block configured to write second data to a second non-volatile memory cell in response to the reset pulse, while writing first data to a first non-volatile memory cell in response to the set pulse.

The non-volatile memory device may further include a delay adjustment circuit configured to adjust delay of the set pulse. The reset pulse generator may generate the reset pulse based on a delay-adjusted set pulse. The delay may be set by the controller.

According to another aspect of the present invention, there is provided a method of operating a non-volatile memory device. The method includes generating a reset pulse generated on a set pulse, providing a reset signal generated according to the reset pulse to a second non-volatile memory cell, while providing a set signal generated according to the set pulse to a first non-volatile memory cell, and simultaneously blocking the set signal from being supplied to the first non-volatile memory cell and the reset signal from being supplied to the second non-volatile memory cell, in response to deactivation of one of the set pulse and the reset pulse.

BRIEF DESCRIPTION OF THE DRAWINGS

Illustrative embodiments will be more clearly understood from the following detailed description taken in conjunction with the accompanying drawings, in which:

FIG. 9 illustrates an enable signal generator included in the set pulse generator of FIG. 7 and operation waveforms of the enable signal generator, according to an exemplary embodiment;

DETAILED DESCRIPTION OF THE EMBODIMENTS

Figure 1:
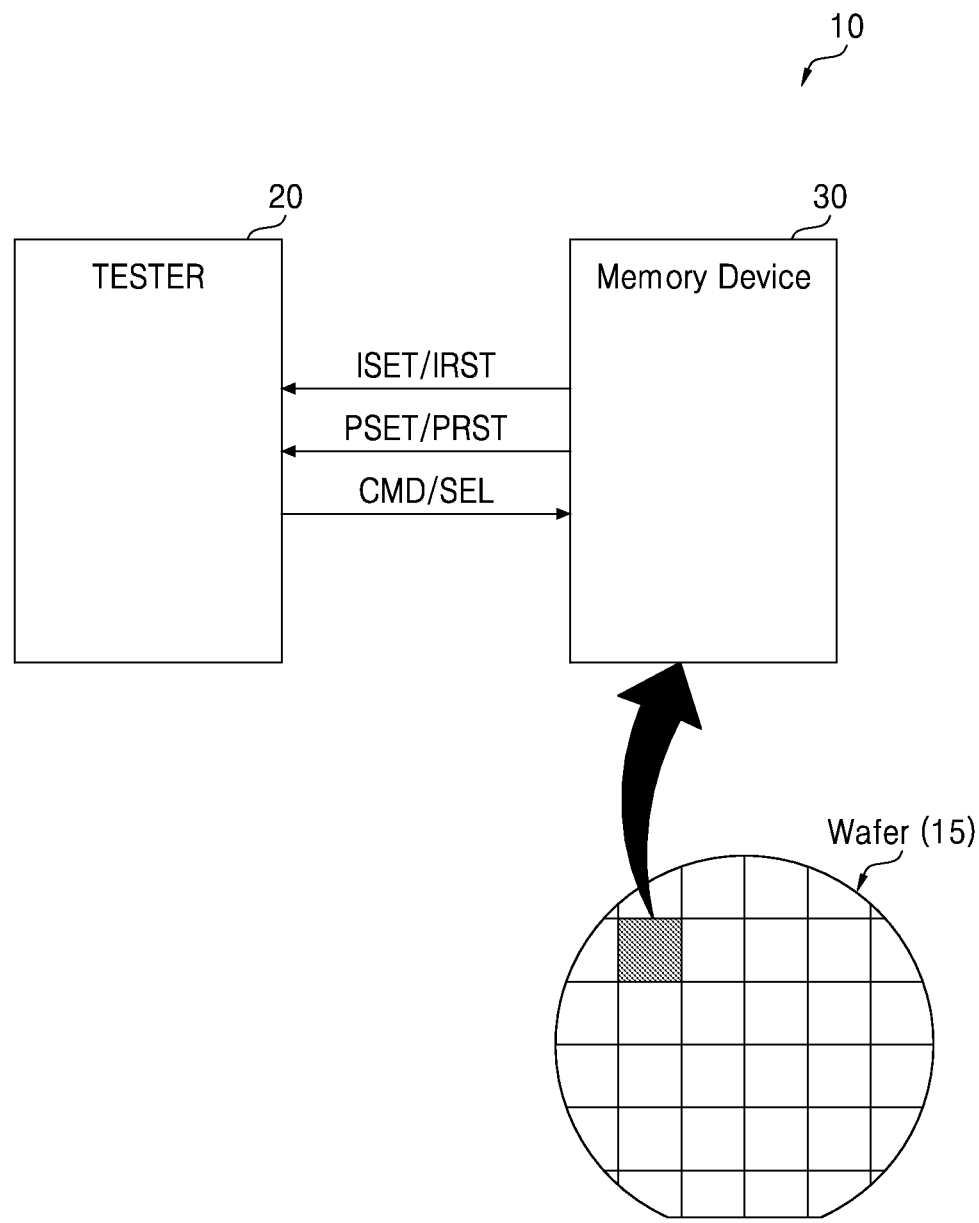
FIG. 1 is a block diagram of a system for explaining a method of programming a delay to a non-volatile memory device, according to an exemplary embodiment.

FIG. 1 is a block diagram of a system 10 for explaining a method of programming a delay to a non-volatile memory device 30, according to an exemplary embodiment. Throughout the specification, "exemplary" refers to an example or illustration. Also, in the present specification, "programmed delay" refers to an amount of delay, a delay duration, or delay information for use in adjusting generation timing of a set pulse and/or generation timing of a reset pulse, which is generated based on one of multiple pulses included in the set pulse.

Referring to FIG. 1, the system 10 includes a tester 20 and the non-volatile memory device 30. The tester 20 is configured to test performance of the non-volatile memory device 30. From the viewpoint of the tester 20, the non-volatile memory device 30 may be a device under test (DUT), for example, and the DUT may be a chip included in a wafer 15, indicated by the shaded area. The non-volatile memory device 30 may be a phase change random access memory (PRAM), for example, which is a type of resistive memory device.

The tester 20 may output a command CMD for simultaneously programming set data and reset data to the non-volatile memory device 30. Herein, the term "simultaneously programming" refers to writing (or programming) second data to another memory cell according to a reset pulse PRST, while writing (or programming) first data to one memory cell according to a set pulse PSET, as shown in FIGS. 4, 13, 15 and 16. The term "substantially simultaneously programming" refers to writing (or programming) second data to another memory cell according to a reset pulse PRST, while writing (or programming) first data to one memory cell according to a set pulse PSET, as shown in FIGS. 4, 13, 15 and 16, as well as writing (or programming) the second data to another memory cell according to the reset pulse PRST immediately after writing (or programming) the first data to one memory cell according to the set pulse PSET, as shown in FIG. 14.

Accordingly, set data, for example, one of data "1" and data "0" (herein, data "1"), and reset data, for example, the other data (herein, data "0"), may be simultaneously programmed to the non-volatile memory device 30 according to the command CMD. Hereinafter, this simultaneous programming is referred to as a set data/reset data simultaneous-program operation. The set data/reset data simultaneous-program operation may also be referred to as an overwrite operation.

According to an embodiment, the tester 20 may further output selection signals SEL, which will be described later with reference to FIG. 7, in addition to the command CMD, to the non-volatile memory device 30. The selection signals SEL may be digital signals including multiple bits. For example, the digital signals may be mode register set (MRS) codes for setting MRS to specific values. When the selection signals SEL output from the tester 20 are sequentially changed, the non-volatile memory device 30 may generate reset pulse PRST at different timings in response to the sequentially changed selection signals SEL.

The tester 20 monitors the waveforms of the set pulse PSET and the reset pulse PRST output from the non-volatile memory device 30. In other words, activation and deactivation points of time of each of the set pulse PSET and the reset pulse PRST may be analyzed by the tester 20. The activation indicates changing the level of a specific signal from a low level to a high level, and the deactivation indicates changing the level of the specific signal from a high level to a low level.

The tester 20 may also monitor a set current ISET and a reset current IRST output from the non-volatile memory device 30. The set current ISET is dependent on the set pulse PSET, and the reset current IRST is dependent on the reset pulse PRST. Herein, the set current ISET refers to a signal (e.g., voltage or current), associated with the set pulse PSET, and the reset current IRST refers to a signal (e.g., voltage or current), associated with the reset pulse IRST. Accordingly, the tester 20 may analyze a profile of a total current corresponding to a sum of the set current ISET and the reset current IRST.

The tester 20 may analyze optimal performance of the non-volatile memory device 30 that is necessary during a set data/reset data simultaneous-program operation, based on the set and rest pulses PSET and PRST and/or the set and reset currents ISET and IRST. For example, the tester 20 may analyze an operating speed, a peak current, and/or read-while-write (RWW) noise of the non-volatile memory device 30. According to the results of the analysis, information about the selection signals SEL capable of selecting an activation point of time (or activation timing) of the reset pulse PRST may be determined. A generation timing of the reset pulse PRST associated with the set pulse PSET may be programmed according to the information.

Figure 7:
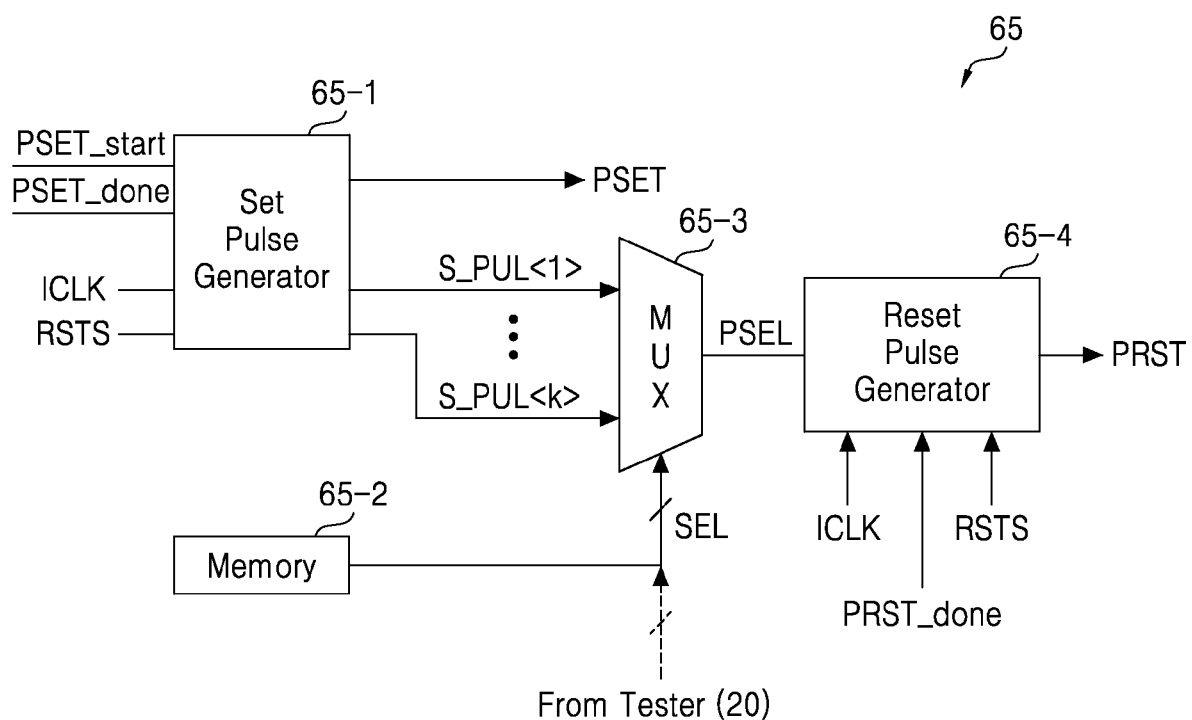
FIG. 7 is a block diagram of a pulse generator illustrated in FIG. 2, according to an exemplary embodiment.

As discussed further with reference to FIG. 7, when a memory 65-2, which generates selection signals SEL, may be implemented using a programmable memory. For example, the programmable memory may be an MRS, and the tester 20 may set or program an MRS code in the MRS. The MRS code may be set when the non-volatile memory device 30 is in a chip state, or may be set after the non-volatile memory device 30 is packaged. Alternatively, the memory 65-2 may implemented using another programmable memory, such as a fusing circuit including fuses, where each of the fuses may be cut or uncut by a setter to set the selection signals SEL. According to the characteristics of the fuses, cutting (or un-fusing) may represent one of data "1" and data "0", and un-cutting (or fusing) may represent the other one of data "1" and data "0". Accordingly, each of the fuses may be a fuse, an anti-fuse, or an e-fuse.

The memory 65-2 may be implemented using a one-time programmable (OTP) memory. As described above, the information about the selection signals SEL capable of selecting the activation point of time of the reset pulse PRST may be set in the memory 65-2 by the tester 20 or a setter.

Figure 2:
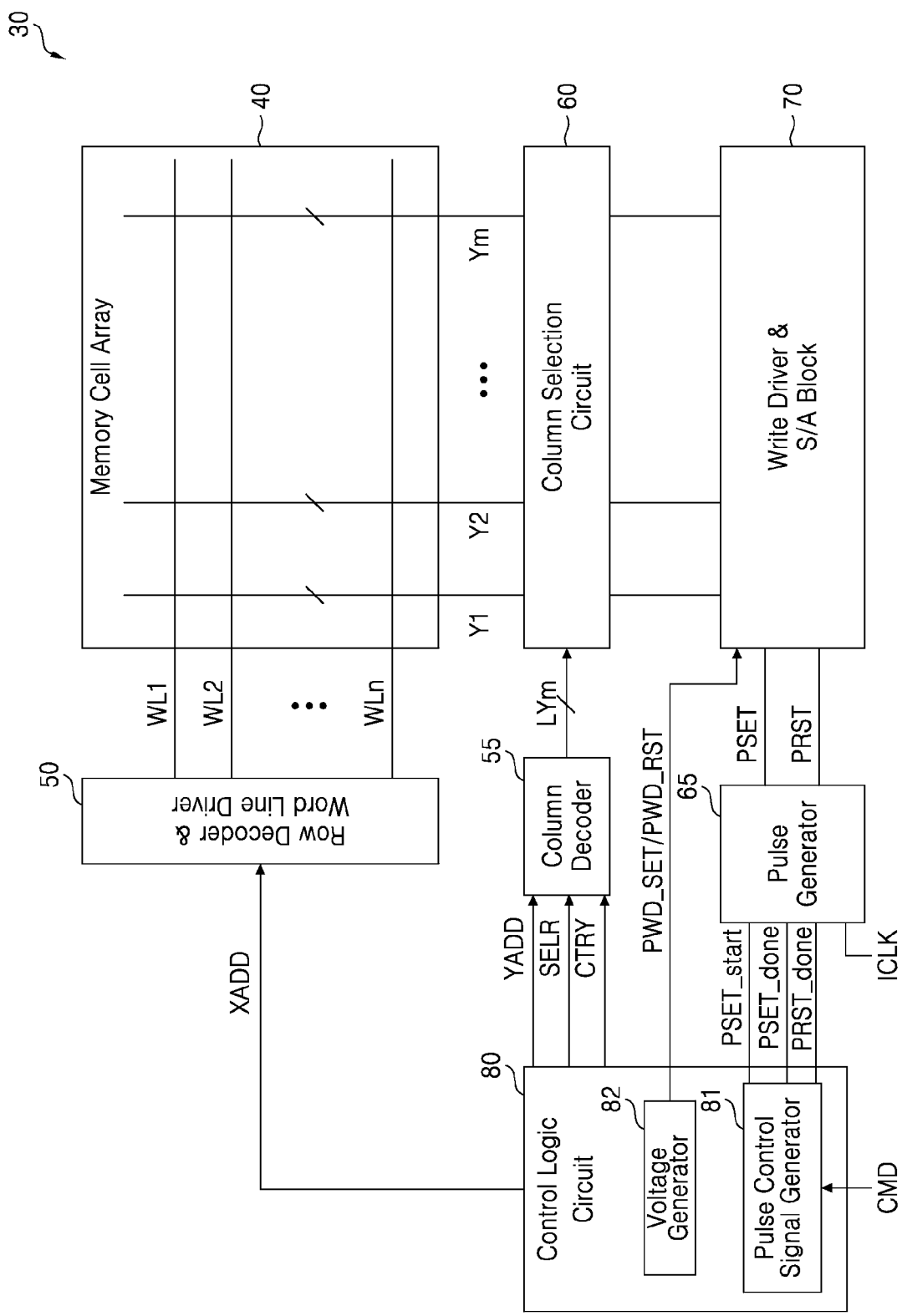
FIG. 2 is a block diagram of the non-volatile memory device illustrated in FIG. 1, according to an exemplary embodiment.

FIG. 2 is a block diagram of the non-volatile memory device 30 of FIG. 1, according to an exemplary embodiment.

In the depicted embodiment, the non-volatile memory device 30, which may be a PRAM, in the present example, includes a memory cell array 40, a row decoder & word line driver 50, a column decoder 55, a column selection circuit 60, a pulse generator 65, a write driver & sense amplifier (S/A) block 70, and a control logic circuit 80. The non-volatile memory device 30 may operate based on a command CMD which commands at least one of a set data/reset data simultaneous-program operation, a set data program operation, a reset data program operation, or a RWW operation.

Figure 20:
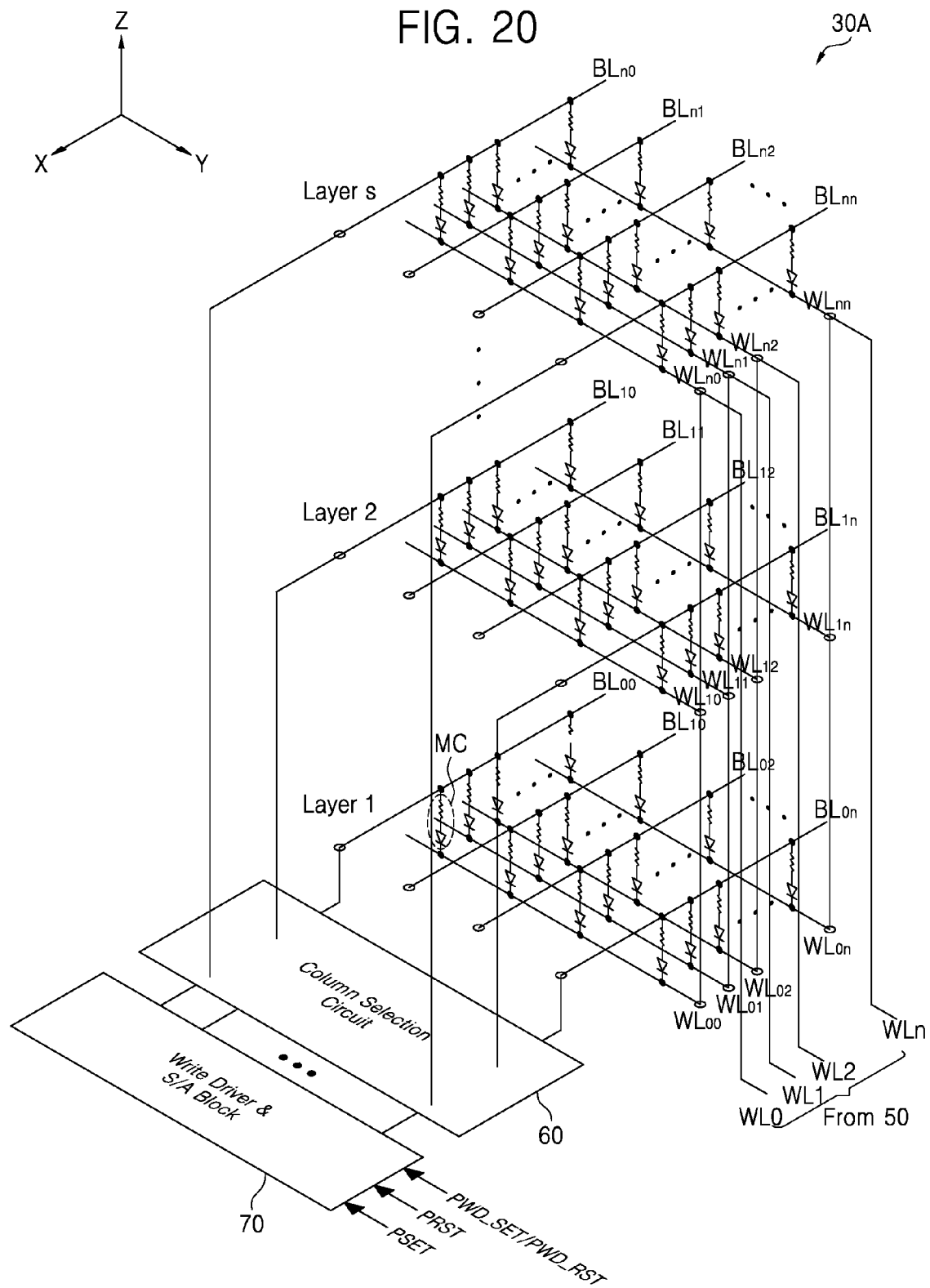
FIG. 20 is a block diagram of a three-dimensional non-volatile memory device, according to an exemplary embodiment.

The memory cell array 40 includes word lines WL1 through WLn (where n is a natural number), bit lines Y1 through Ym (where m is a natural number), and PRAM cells each connected to the word lines WL1 through WLn and the bit lines Y1 through Ym, respectively. The memory cell array 40 may be two-dimensionally implemented as shown in FIG. 2 or may be three-dimensionally implemented as shown in FIG. 20, for example.

The row decoder & word line driver 50 performs operations of selecting one of the word lines WL1 through WLn and of driving the selected word line with a necessary operational voltage, based on row addresses XADD output from the control logic circuit 80.

The column decoder 55 generates column selection signals LYm based on column addresses YADD output from the control logic circuit 80. The column selection circuit 60 may control the connection between each of the bit lines Y1 through Ym and the write driver & S/A block 70 in response to the column selection signals LYm. Structure and operation of a switching circuit included in the column decoder 55 will be described below with reference to FIG. 5.

The pulse generator 65 generates the set pulse PSET and the reset pulse PRST based on first and second set pulse control signals PSET_start and PSET_done, a reset pulse control signal PRST_done, and a clock signal ICLK. Programmed delay may exist between the generation timing of the set pulse PSET and the generation timing of the reset pulse PRST.

For example, in a testing stage, the pulse generator 65 may generate the set pulse PSET and the reset pulse PRST based on the first and second set pulse control signals PSET_start and PSET_done, the reset pulse control signal PRST_done, the clock signal ICLK, and the selection signals SEL output from the tester 20. In a normal operation stage, the pulse generator 65 may generate the set pulse PSET and the reset pulse PRST based on first and second set pulse control signals PSET_start and PSET_done, a reset pulse control signal PRST_done, the clock signal ICLK, and the selection signals SEL output from the memory 65-2 of FIG. 7. In the testing stage and the normal operation stage, a point of time the reset pulse PRST is activated may be determined based on the selection signals SEL.

The write driver & S/A block 70 generates a set current and/or a reset current based on a set bias signal PWD_SET, a reset bias signal PWD_RST, the set pulse PSET, and the reset pulse PRST.

The control logic circuit 80 controls operations of at least one of the row decoder & word line driver 50, the column decoder 55, the pulse generator 65 and the write driver & sense amplifier (S/A) block 70. In the depicted embodiment, the control logic circuit 80 includes a pulse control signal generator 81 and a voltage generator 82. The pulse control signal generator 81 generates the first and second set pulse control signals PSET_start and PSET_done and the reset pulse control signal PRST_done based on a command CMD output from a memory controller 310 (see FIG. 18) or the command CMD output from the tester 20. The voltage generator 82 generates the set and reset bias signals PWD_SET and PWD_RST based on the command CMD.

Figure 3:
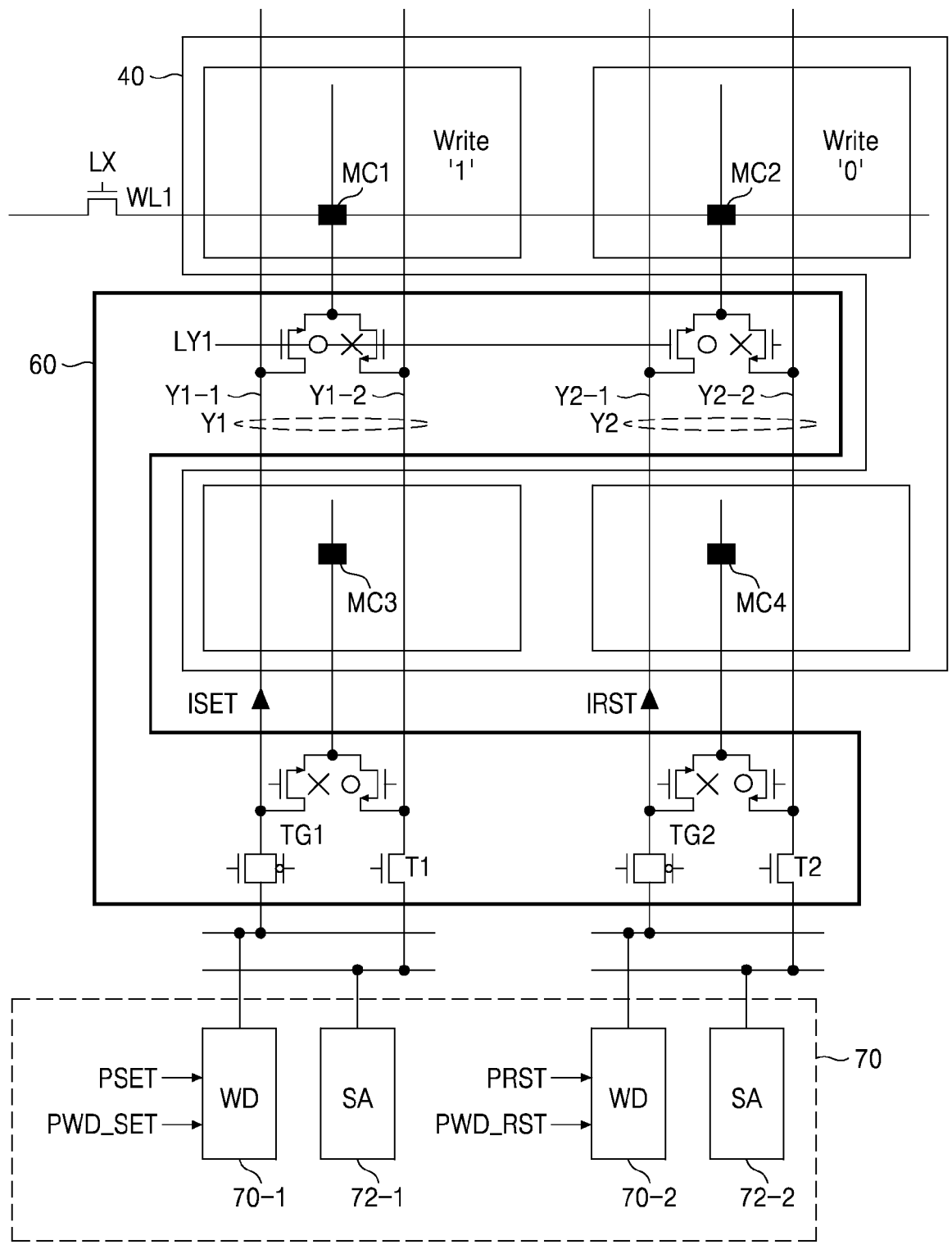
FIG. 3 is a schematic block diagram for explaining a set data/reset data simultaneous-program operation of the non-volatile memory device illustrated in FIG. 2, according to an exemplary embodiment.
Figure 4:
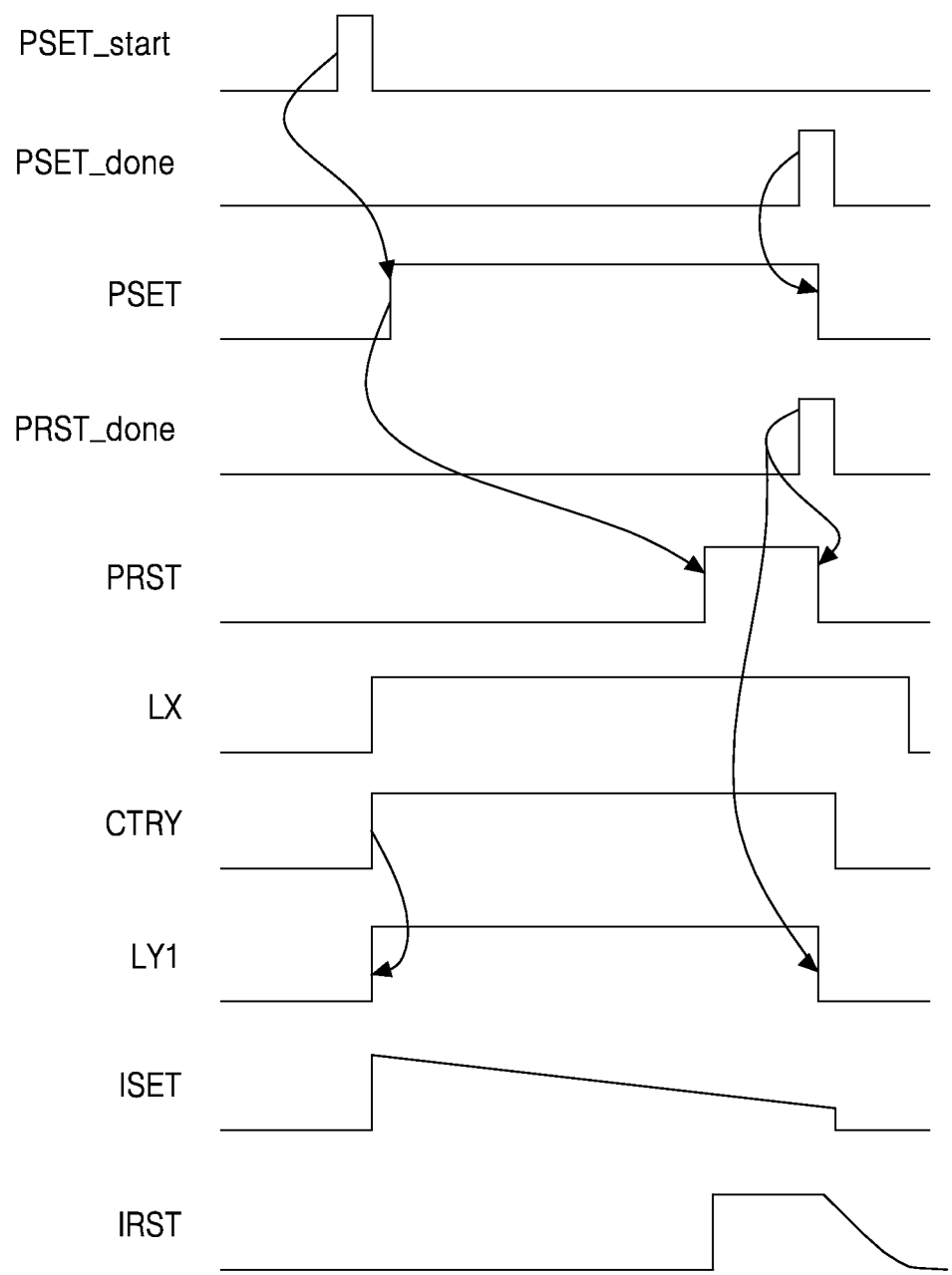
FIG. 4 is a timing diagram of control signals for explaining operations of the non-volatile memory device illustrated in FIG. 3, and illustrates a scheme for generating switching signals, according to an exemplary embodiment.
Figure 5:
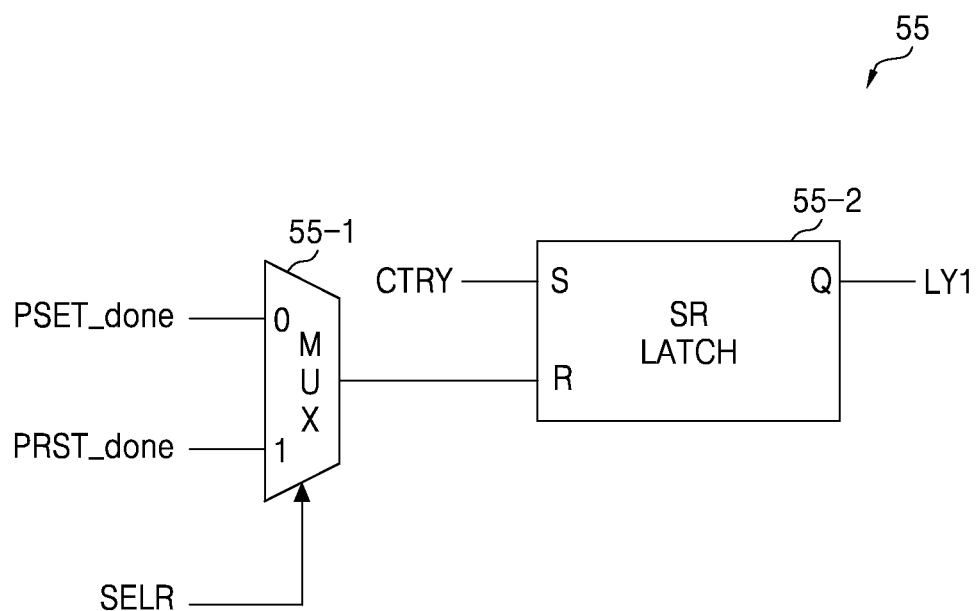
FIG. 5 is a block diagram of a switching circuit capable of generating a switching signal of FIG. 4, according to an exemplary embodiment.
Figure 6:
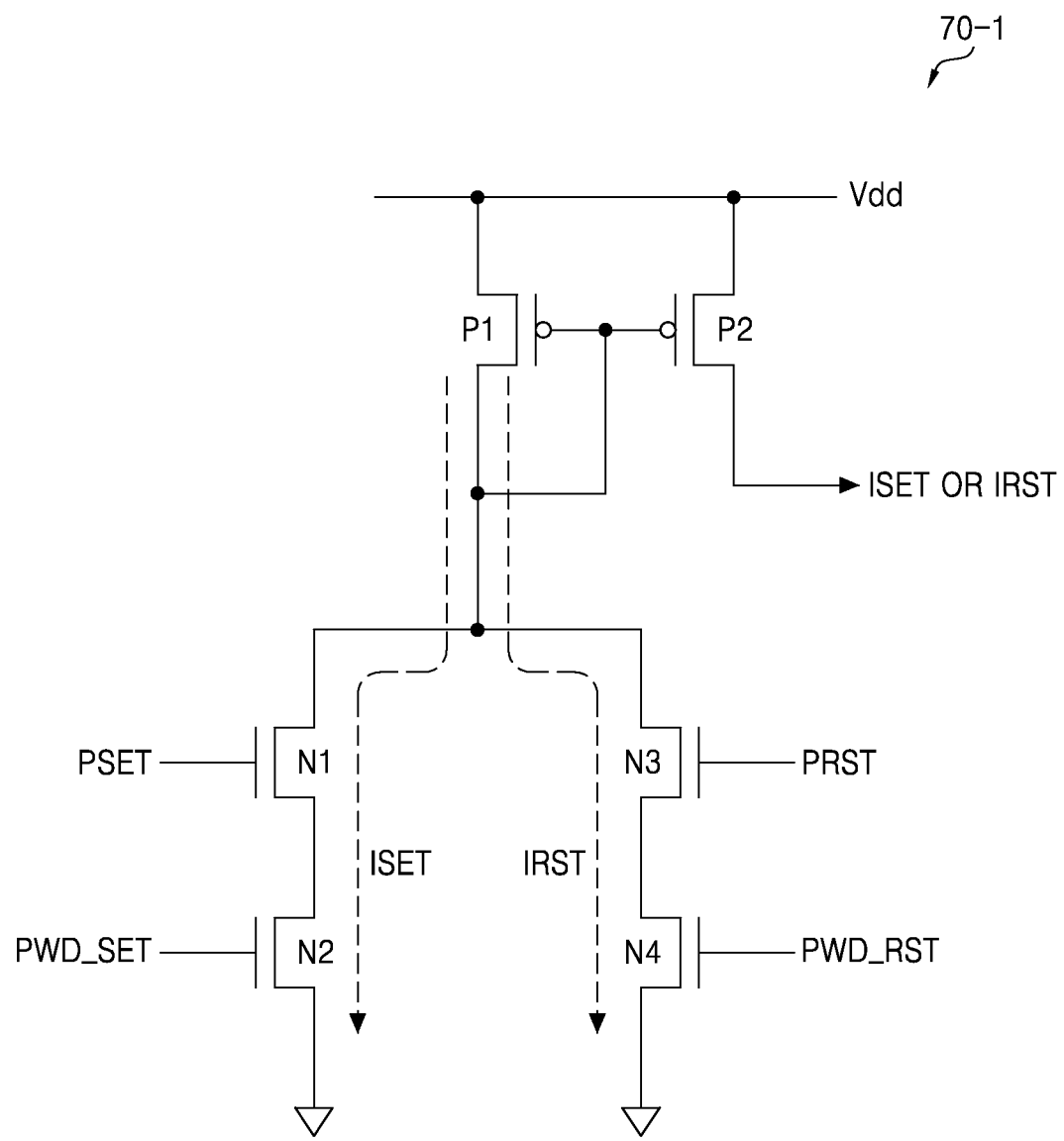
FIG. 6 is a block diagram of a write driver illustrated in FIG. 3, according to an exemplary embodiment.

FIG. 3 is a schematic block diagram for explaining a set data/reset data simultaneous-program operation of the non-volatile memory device 30 illustrated in FIG. 2, according to an exemplary embodiment. FIG. 4 is a timing diagram illustrating the first and second set pulse control signals PSET_start and PSET_done and the reset pulse control signal PRST_done for explaining operation of the non-volatile memory device 30 illustrated in FIG. 3, according to an exemplary embodiment, and illustrates a scheme for generating switching signals LX and LY1. FIG. 5 is a block diagram of a switching circuit capable of generating the switching signal LY1 of FIG. 4, according to an exemplary embodiment, and FIG. 6 is a block diagram of a first write driver 70-1 included in the write driver & S/A block 70 illustrated in FIG. 3, according to an exemplary embodiment.

An exemplary operation, in which the reset data (e.g., data "0") is programmed in a second PRAM cell MC2 while the set data (e.g., data "1") is being programmed in a first PRAM cell MC1, is described in detail with reference to FIGS. 2 through 6.

The write driver & S/A block 70 includes a first write driver 70-1 and a second write driver 70-2, which have substantially the same structure. Accordingly, it is assumed that the set pulse PSET and an activated set bias signal PWD_SET are supplied to the first write driver 70-1, and that the reset pulse PRST and an activated reset bias signal PWD_RST are supplied to the second write driver 70-2.

Thus, while switches are turned on according to the switching signals LX and LY1, and a first transmission gate TG1 is turned on, the first write driver 70-1 supplies the set current ISET to the first PRAM cell MC1 via the first transmission gate TG1 and a first write bit line Y1-1. At the same time, while switches are turned on according to the switching signals LX and LY1, and a second transmission gate TG2 is turned on, the second write driver 70-2 supplies the reset current IRST to the second PRAM cell MC2 via the second transmission gate TG2 and a second write bit line Y1-2. In other words, while data "1" is being programmed in the first PRAM cell MC1 according to the set current ISET, data "0" is programmed in the second PRAM cell MC2 according to the reset current IRST.

According to an embodiment, the write driver & S/A block 70 also includes SAs 72-1 and 72-2. The SAs 72-1 and 72-2 sense and amplify data stored in third and fourth PRAM cells MC3 and MC4, respectively.

A memory area or memory region including the first and second PRAM cells MC1 and MC2 may be an area (or a bank) on which an erase operation or a write operation is performed, and a memory area or memory region including the third and fourth PRAM cells MC3 and MC4 may be an area (or a bank) on which a read operation is performed.

As described above, the non-volatile memory device 30 may perform a set data/reset data simultaneous-program operation and/or a RWW operation.

The first set pulse control signal PSET_start is a signal for controlling activation of the set pulse PSET, and the second set pulse control signal PSET_done is a signal for controlling deactivation of the set pulse PSET. A relationship between each of the first and second set pulse control signals PSET_start and PSET_done and the set pulse PSET is described below with reference to FIG. 9.

The reset pulse control signal PRST_done is a signal for controlling a deactivation of the reset pulse PRST. Referring to FIG. 4, activation of the reset pulse PRST depends on activation of the set pulse PSET, and deactivation of the reset pulse PRST is determined according to the reset pulse control signal PRST_done.

The switching signal LX is controlled by the row decoder & word line driver 50. In FIG. 4, it is illustrated for convenience of explanation that the switching signal LY1 is determined based on a control signal CTRY and the reset pulse control signal PRST_done. However, as illustrated in FIG. 5, deactivation of the switching signal LY1 may be determined based on one of the second set pulse control signal PSET_done and the reset pulse control signal PRST_done.

Referring to FIGS. 2 and 5, the column decoder 55 includes the switching circuit which generates the switching signal LY1. For convenience of explanation, FIG. 5 illustrates a single representative switching circuit.

The switching circuit includes a selection circuit 55-1 and an SR latch 55-2. The selection circuit 55-1 may output either the second set pulse control signal PSET_done or the reset pulse control signal PRST_done, based on the selection signal SELR output from the control logic circuit 80. For example, the selection circuit 55-1 may be implemented using a multiplexer (MUX), and may output the second set pulse control signal PSET_done when the selection signal SELR is at a low level, for example. Likewise, the selection circuit 55-1 may also output the reset pulse control signal PRST_done when the selection signal SELR is at a high level. Information used to determine the level of the selection signal SELR may be stored in a memory (not shown). The SR latch 55-2 may generate the switching signal LY1 based on the control signal CTRY received via a set input terminal S and an output signal of the selection circuit 55-1 received via a reset input terminal R.

As illustrated in FIG. 6, the first write driver 70-1 includes a current mirror including PMOS transistors P1 and P2, a set current generation circuit including NMOS transistors N1 and N2, and a reset current generation circuit including NMOS transistors N3 and N4. The set current generation circuit generates the set current ISET in response to the set pulse PSET and an activated set bias signal PWD_SET. The reset current generation circuit generates the reset current IRST in response to the reset pulse PRST and an activated reset bias signal PWD_RST. The current mirror mirrors the set current ISET or the reset current IRST, and transmits the mirrored set current ISET or the mirrored reset current IRST to the first write bit line Y1-1.

FIG. 7 is a block diagram of the pulse generator 65 of FIG. 2, according to an exemplary embodiment. Referring to FIG. 7, the pulse generator 65 includes a set pulse generator 65-1, the memory 65-2, a selector 65-3, and a reset pulse generator 65-4.

Figure 10:
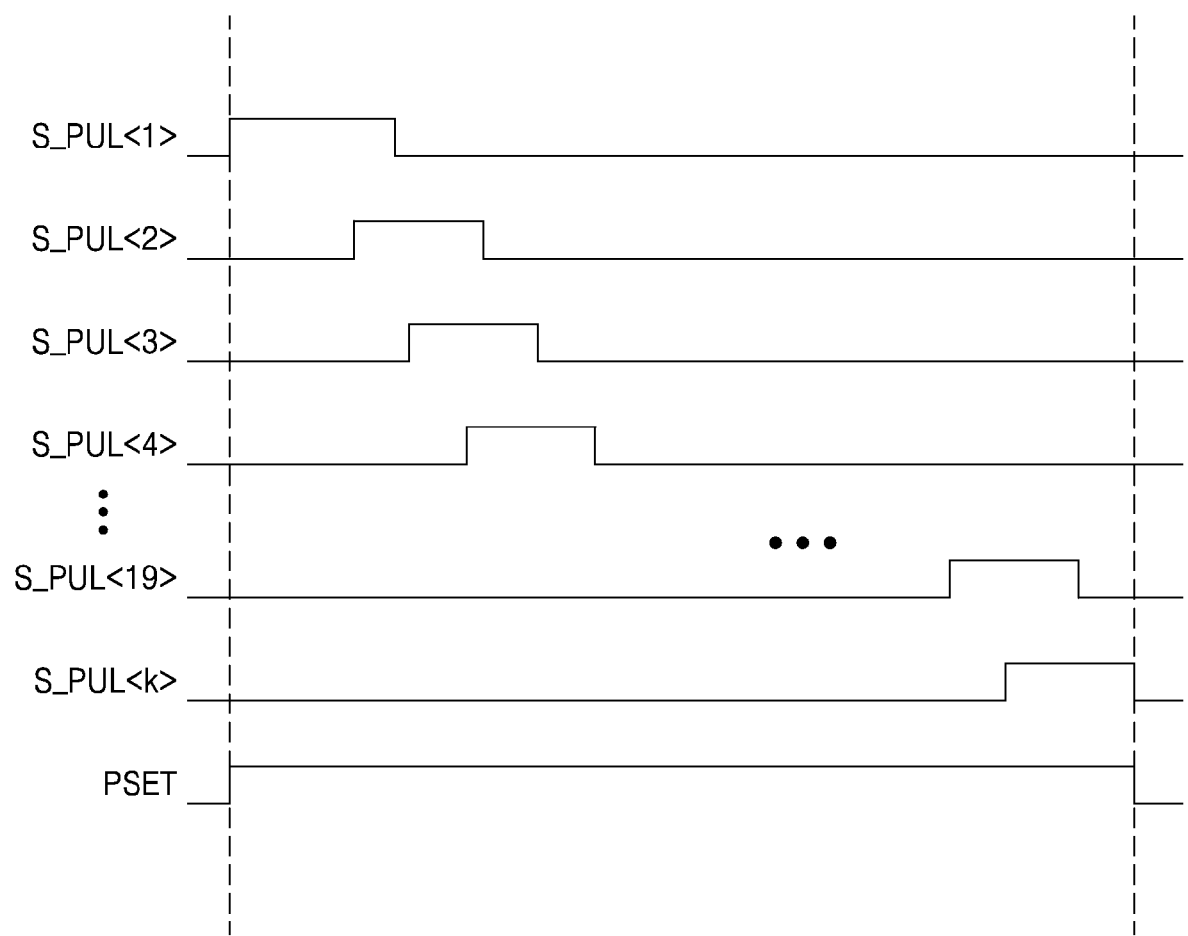
FIG. 10 is a timing diagram of output signals of the set pulse generator of FIG. 7, according to an exemplary embodiment.

During a set data/reset data simultaneous-program operation, the set pulse generator 65-1 sequentially generates first through k-th pulses S_PUL<1> through S_PUL<k> that constitute the set pulse PSET as illustrated in FIG. 10, based on the first and second set pulse control signals PSET_start and PSET_done and the clock signal ICLK. Each of the first through k-th pulses S_PUL<1> through S_PUL<k> has an overlap duration.

The memory 65-2 stores information about the selection signals SEL. Accordingly, the memory 65-2 outputs the selection signals SEL according to the stored information. The programmed delay may be determined according to the selection signals SEL. As described above, the memory 65-2 may be implemented using a programmable memory capable of storing information about the selection signals SEL, such as an MRS, a fusing circuit, or an OTP memory. For example, since the chips included in the wafer 15 may have different characteristics, information about the selection signals SEL in which the characteristics have been reflected may be stored in respective memories of the chips, for example.

The selector 65-3 outputs one of the first through k-th pulses S_PUL<1> through S_PUL<k> as a pulse PSEL based on the selection signals SEL. The selector 65_3 may be implemented by using a MUX, for example. The memory 65-2 and the selector 65-3 perform a function of a delay adjustment circuit that adjusts delay of the set pulse PSET. In other words, the selector 65-3 may adjust a timing of generating the rest pulse PRST, by outputting one of the first through k-th pulses S_PUL<1> through S_PUL<k> as the pulse PSEL based on the selection signals SEL.

During a set data/reset data simultaneous-program operation, the reset pulse generator 65-4 generates the reset pulse PRST based on the clock signal ICLK and the pulse PSEL output from the selector 65-3. In other words, the timing of generating the reset pulse PRST is determined according to the pulse PSEL output from the selector 65-3. Each of the set pulse generator 65-1 and the reset pulse generator 65-4 may be initialized in response to a reset signal RSTS.

As described above with reference to FIG. 3, the first write driver 70-1 may provide the set current ISET generated based on the set pulse PSET and the set bias signal PWD_SET to the first PRAM cell MC1. Simultaneously, the second write driver 70-2 may provide the reset current IRST generated based on the reset pulse PRST and the reset bias signal PWD_RST to the second PRAM cell MC2. For example, the levels and the slopes of the set and reset currents ISET and IRST may be adjusted according to the levels and the activation durations of the set and reset bias signals PWD_SET and PWD_RST, respectively.

Figure 8:
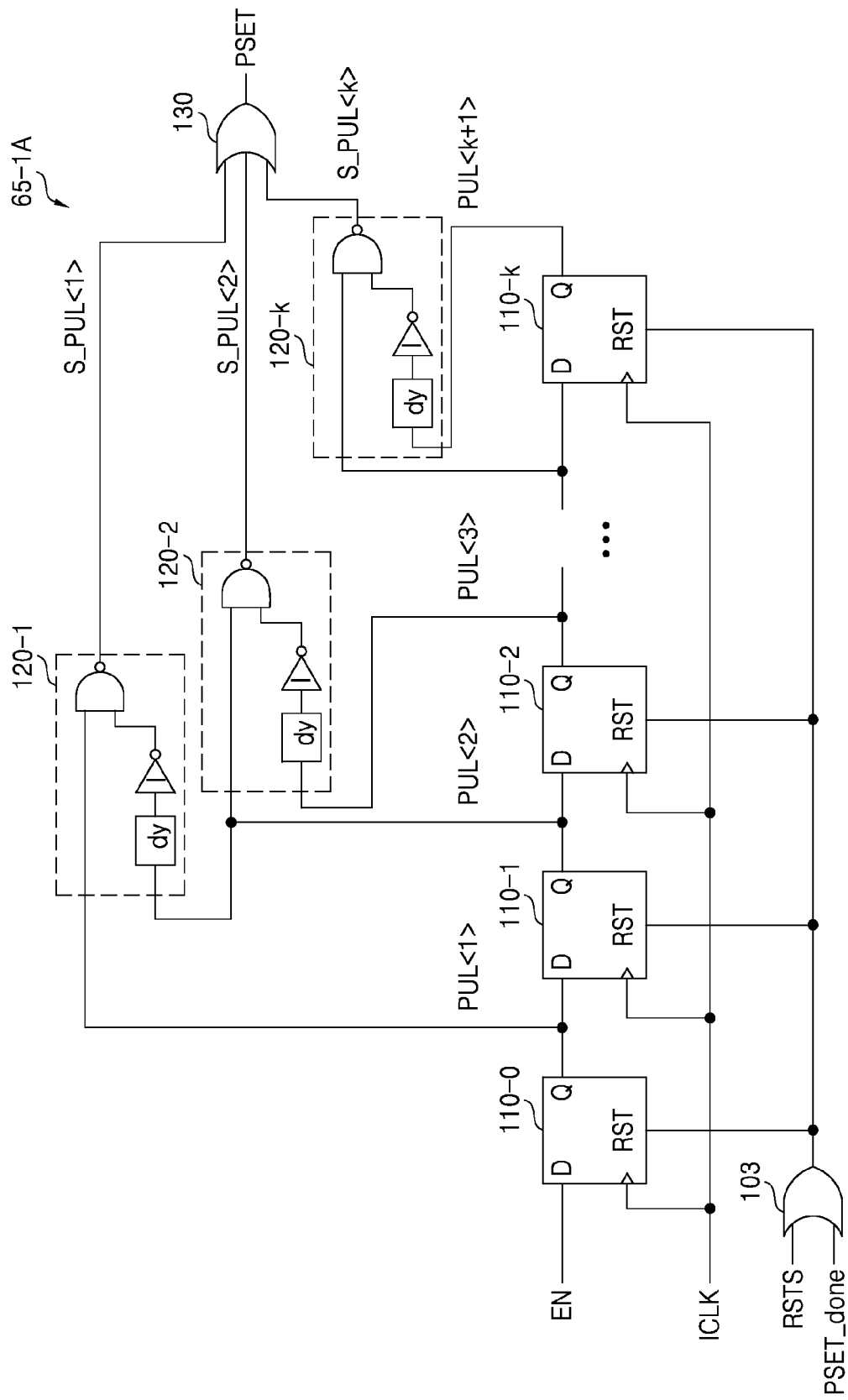
FIG. 8 is a block diagram of a set pulse generator illustrated in FIG. 7, according to an exemplary embodiment.

FIG. 8 is a block diagram of a set pulse generator 65-1A which is an embodiment of the set pulse generator 65-1 illustrated in FIG. 7, according to an exemplary embodiment. FIG. 9 illustrates an enable signal generator 101 included in the set pulse generator 65-1 of FIG. 7 and operation waveforms of the enable signal generator 101, according to an exemplary embodiment. FIG. 10 is a waveform diagram of the output signals of the set pulse generator 65-1 of FIG. 7, according to an exemplary embodiment.

First, referring to FIG. 9, a set input terminal S of the enable signal generator 101 receives the first set pulse control signal PSET_start, and a reset input terminal R of the enable signal generator 101 receives the second set pulse control signal PSET_done. Accordingly, an activation duration of an enable signal EN is determined according to the first and second set pulse control signals PSET_start and PSET_done.

Referring to FIGS. 7 through 10, the set pulse generator 65-1A includes the enable signal generator 101, a first logic gate 103, a first shift register made up of a first group of first through (k+1)th flip-flops 110-0 through 110-k, a first group of first through k-th pulse generators 120-1 through 120-k, and a second logic gate 130.

The first logic gate 103 performs an OR operation on the reset signal RSTS and the second set pulse control signal PSET_done and supplies an OR signal corresponding to a result of the OR operation to a reset terminal RST of each of the first through (k+1)th flip-flops 110-0 through 110-k. The first through (k+1)th flip-flops 110-0 through 110-k in the first group are serially (or cascade) connected to one another. The first shift register may be implemented by using a serial-input parallel-output shift register, for example. The first flip-flop 110-0 latches a logic level of the enable signal EN output from the enable signal generator 101, in response to the clock signal ICLK. For example, during a set data/reset data simultaneous-program operation, the enable signal EN is activated to a high level in response to the first set pulse control signal PSET_start.

The first through k-th pulse generators 120-1 through 120-k in the first group may generate the first through k-th pulses S_PUL<1> through S_PUL<k> using the output signals of paired flip-flops 110-0 and 110-1, 110-1 and 110-2, . . . , and 110-(k−1) and 110-k, respectively, from among the first through (k+1)th flip-flops 110-0 through 110-k in the first group. For example, the first pulse generator 120-1 generates the first pulse S_PUL<1> in response to an output signal PUL<1> of the first flip-flop 110-0 and an output signal PUL<2> of the second flip-flop 110-1, via an inverter I and a delay circuit dy. In particular, the delay circuit dy delays the output signal PUL<2> of the second flip-flop 110-1, and the inverter I inverts an output signal of the delay circuit dy.

In a similar manner, the k-th pulse generator 120-k generates the k-th pulse S_PUL<k> in response to an output signal PUL<k> of the k-th flip-flop 110-(k−1) and an output signal PUL<k+1> of the (k+1)th flip-flop 110-k, via an inverter I and a delay circuit dy. In particular, the delay circuit dy delays the output signal PUL<k+1> of the (k+1)th flip-flop 110-k, and the inverter I inverts an output signal of the delay circuit dy.

The second logic gate 130 performs a logic operation on the first through k-th pulses S_PUL<1> through S_PUL<k> respectively output from the first through k-th pulse generators 120-1 through 120-k to generate the set pulse PSET. The second logic gate 130 may be implemented by using an OR gate, for example.

Figure 11:
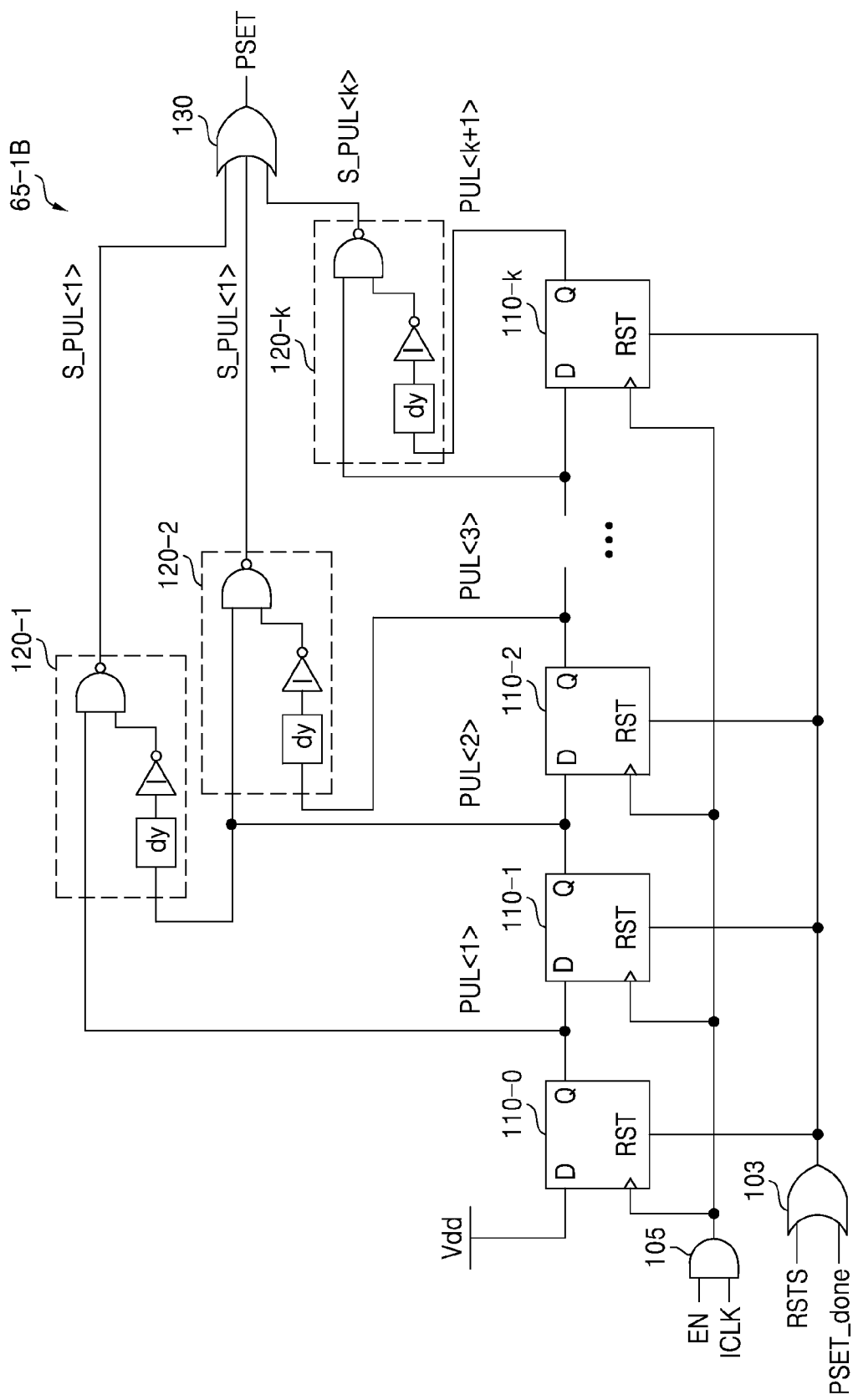
FIG. 11 is a block diagram of a set pulse generator illustrated in FIG. 7, according to another exemplary embodiment.

FIG. 11 is a block diagram of a set pulse generator 65-1B which is another configuration of the set pulse generator 65-1 illustrated in FIG. 7, according to an exemplary embodiment. A structure of the set pulse generator 65-1B of FIG. 11 is substantially the same as that of the set pulse generator 65-1A of FIG. 8 except that a power supply voltage Vdd is supplied to an input terminal D of the first flip-flop 110-0 and that a mask circuit 105 is further included.

The mask circuit 105 controls transmission of the clock signal ICLK based on the logic level of the enable signal EN output from the enable signal generator 101. For example, when the mask circuit 105 is implemented by using an AND gate and the enable signal EN is at high level, the AND gate 105 provides the clock signal ICLK to a clock terminal of each of the first through (k+1)th flip-flops 110-0 through 110-k. On the other hand, when the mask circuit 105 is implemented by using an AND gate and the enable signal EN is at low level, the AND gate 105 outputs a direct current (DC) signal at a low level.

Figure 12:
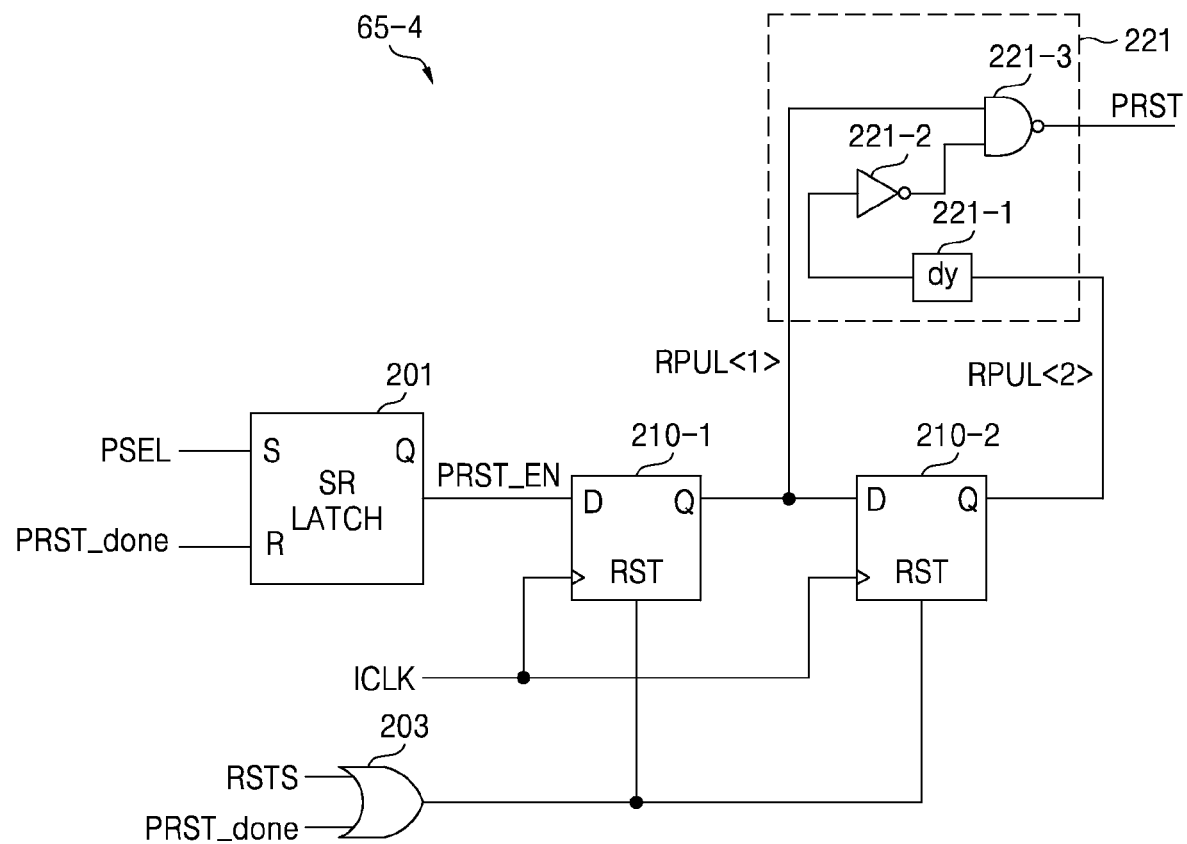
FIG. 12 is a block diagram of a reset pulse generator illustrated in FIG. 7, according to an exemplary embodiment.

FIG. 12 is a block diagram of the reset pulse generator 65-4 of FIG. 7, according to an exemplary embodiment. The reset pulse generator 65-4 includes an SR latch 201, a third logic gate 203, a second shift register made up of a second group of flip-flops 210-1 and 210-2, and a logic gate circuit 221.

The SR latch 201 outputs a reset enable signal PRST_EN based on the pulse PSEL output from the selection circuit 65-3 and received via a set input terminal S and the reset pulse control signal PRST_done received via a reset input terminal R. The third logic gate 203 performs an OR operation on the reset signal RSTS and the reset pulse control signal PRST_done, and supplies an OR signal corresponding to a result of the OR operation to a reset terminal RST of each of the flip-flops 210-1 and 210-2. The flip-flops 210-1 and 210-2 in the second group are serially (or cascade) connected to one another. The second shift register may be implemented using a serial-input parallel-output shift register, for example.

The logic gate circuit 221 generates the reset pulse PRST using output signal RPUL<1> and RPUL<2> respectively output from the flip-flops 210-1 and 210-2. The logic gate circuit 221 performs a NAND operation on the output signal RPUL<1> of the flip-flop 210-1 and the output signal RPUL<2> of the flip-flop 210-2, via a delay circuit 221-1 and an inverter 221-2, to generate the reset pulse PRST. The delay circuit 221-1 delays the output signal RPUL<2> of the flip-flop 210-2, and the inverter 221-2 inverts an output signal of the delay circuit 221-1.

Since a duration of the reset pulse PRST is shorter than that of the set pulse PSET, the number of flip-flops 210-1 and 210-2 in the second group is less than the number of flip-flops 110-0 through 110-k in the first group. Although the reset pulse generator 65-4 includes the two flip-flops 210-1 and 210-2, and a single logic gate circuit 221, as depicted in FIG. 12, the structure of the reset pulse generator 65-4 may be modified into a structure substantially the same as the set pulse generator 65-1A of FIG. 8, with regard to flip-flops, in order to increase the duration of the reset pulse PRST.

Figure 13:
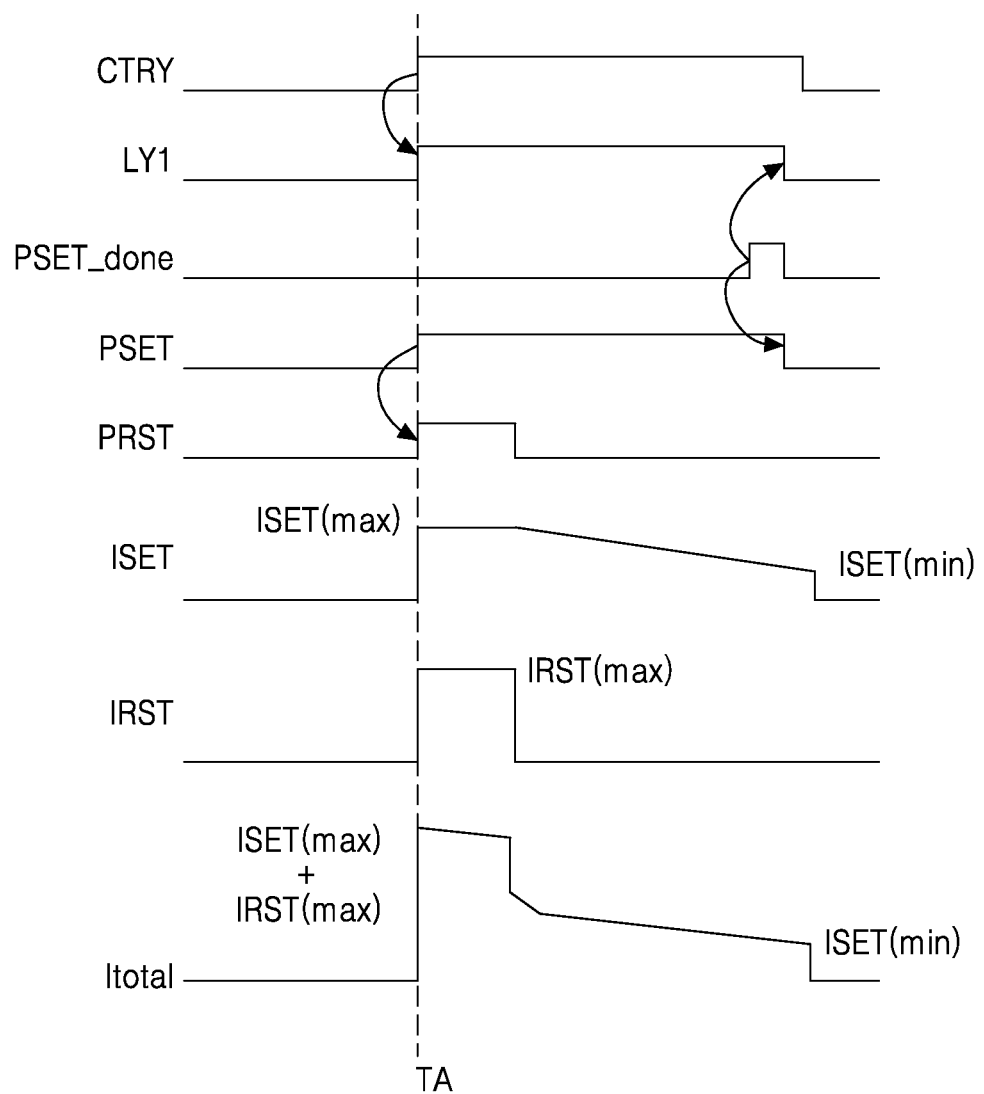
FIG. 13 is a timing diagram illustrating a current profile during a set data/reset data simultaneous-program operation, according to an exemplary embodiment.
Figure 14:
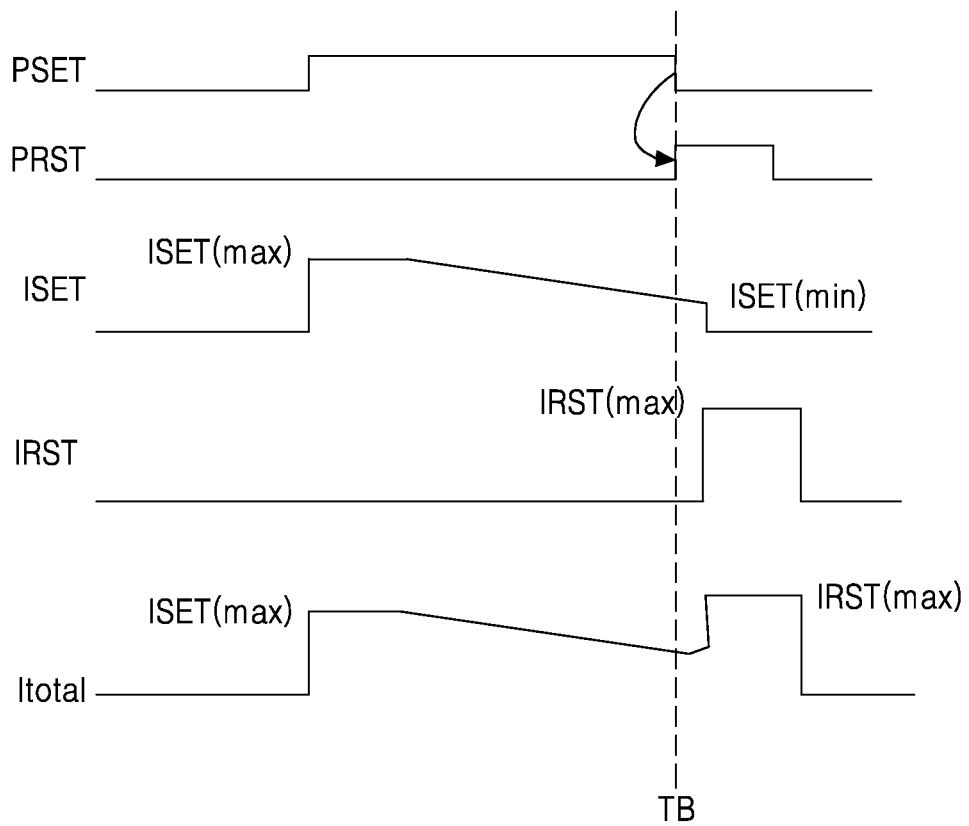
FIG. 14 is a timing diagram illustrating current profile during a set data/reset data simultaneous-program operation, according to another exemplary embodiment.

FIG. 13 is a timing diagram illustrating an example of a current profile during a set data/reset data simultaneous-program operation, according to an exemplary embodiment. Referring to FIGS. 5 and 13, the switching signal LY1 is activated based on an activation of the control signal CTRY and is deactivated based on the second set pulse control signal PSET_done.

The reset pulse PRST is activated according to an activation of the set pulse PSET and is deactivated after a duration that is determined according to the structure of the reset pulse generator 65-4 of FIG. 12. In other words, the information about the selection signals SEL may be stored or set in the memory 65-2 such that an activation point of time of the set pulse PSET is synchronized with that of the reset pulse PRST (or the activation points of time of the set pulse PSET and the reset pulse PRST are consistent with each other completely or within a design allowable range) at a point of time TA. A maximum value of a total current Itotal depends on a maximum value ISET(max) of the set current ISET and a maximum value IRST(max) of the reset current IRST, and a minimum value of the total current Itotal depends on a minimum value ISET(min) of the set current ISET.

FIG. 14 is a timing diagram illustrating another example of a current profile during a set data/reset data simultaneous-program operation, according to an exemplary embodiment.

The information about the selection signals SEL may be stored or set in the memory 65-2 such that a deactivation point of time of the set pulse PSET is synchronized with an activation point of time of the reset pulse PRST at a point of time TB. FIG. 14 illustrates a total current Itotal corresponding to a sum of the set current ISET output from the first write driver 70-1 and the reset current IRST output from the second write driver 70-2.

Figure 15:
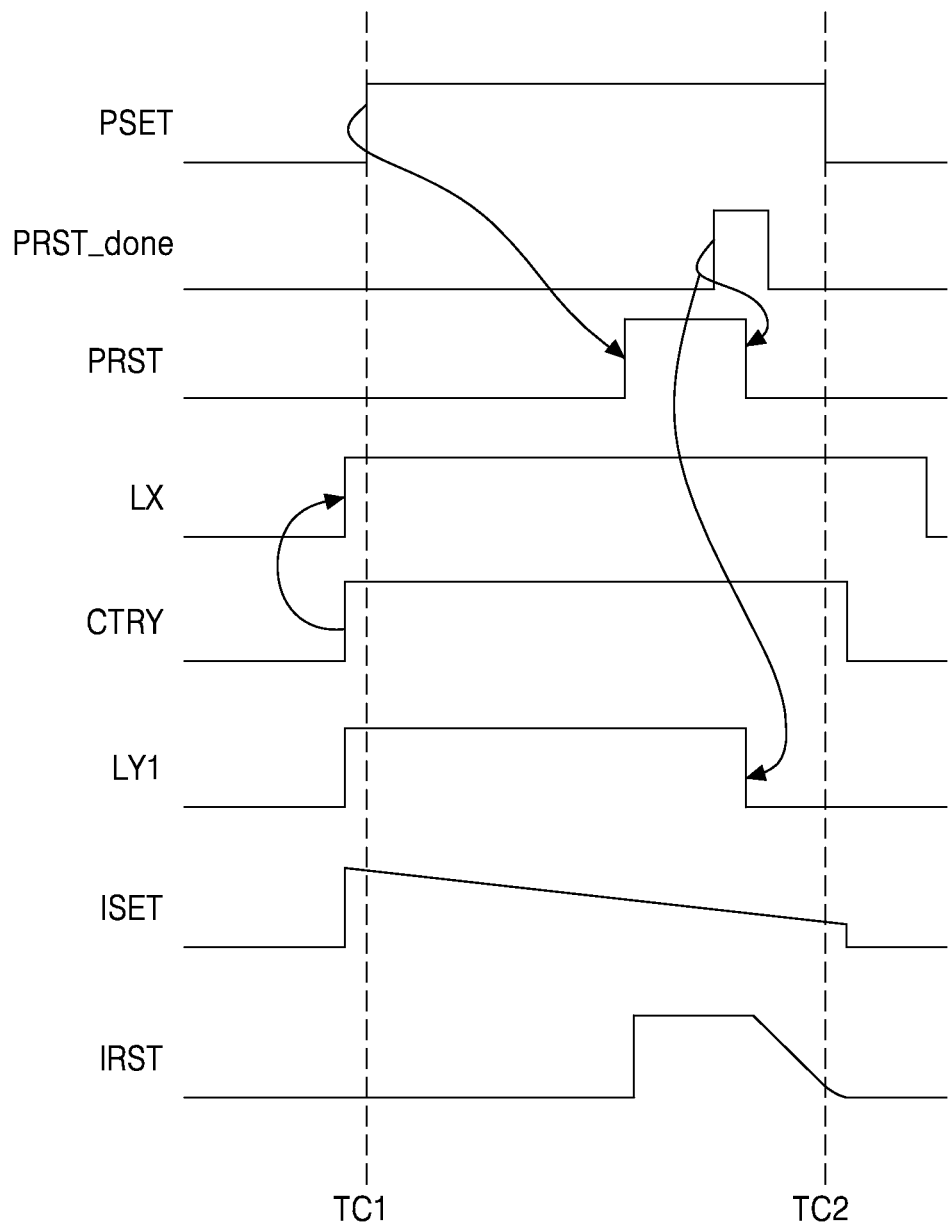
FIG. 15 is a timing diagram of a set pulse and a reset pulse, according to an exemplary embodiment.

FIG. 15 is a timing diagram of the set pulse PSET and the reset pulse PRST according to an exemplary embodiment. Referring to FIGS. 5 and 15, the switching signal LY1 is activated according to an activation of the control signal CTRY and is deactivated according to the reset pulse control signal PRST_done.

A point of time at which the reset pulse PRST is activated may be determined according to how the information about the selection signals SEL is set in the memory 65-2. In other words, the point of time at which the reset pulse PRST is activated may be determined to be between points of time TC1 and TC2 according to the information set in the memory 65-2. Information used to generate the selection signals SEL may be stored or set in the memory 65-2 such that a duration of the reset pulse PRST exists within a duration of the set pulse PSET as shown in FIG. 15.

Figure 16:
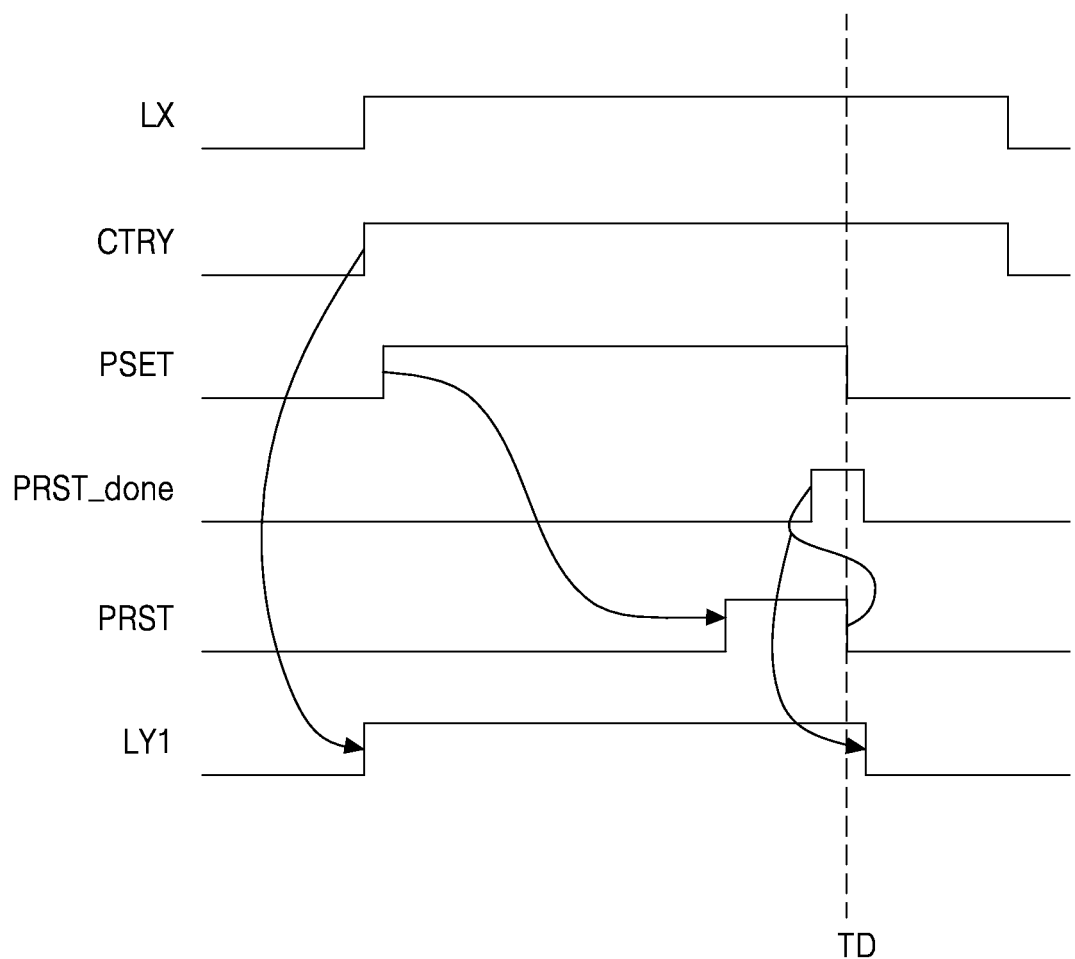
FIG. 16 is a timing diagram of a set pulse and a reset pulse, according to another exemplary embodiment.

FIG. 16 is a timing diagram of the set pulse PSET and the reset pulse PRST according to another exemplary embodiment. Referring to FIGS. 5 and 16, the switching signal LY1 is activated according to an activation of the control signal CTRY and is deactivated according to the reset pulse control signal PRST_done. The information about the selection signals SEL may be stored or set in the memory 65-2 such that a deactivation point of time of the set pulse PSET is synchronized with a deactivation point of time of the reset pulse PRST at a point of time TD.

Figure 17:
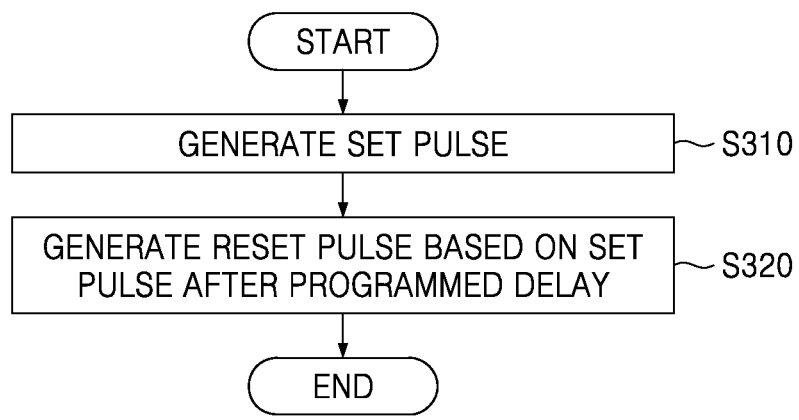
FIG. 17 is a flowchart of an operation of the non-volatile memory device of FIG. 1, according to an exemplary embodiment.
Figure 18:
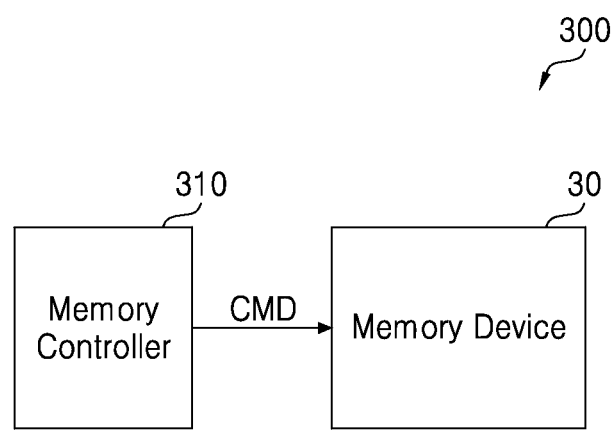
FIG. 18 is a block diagram of a system including the non-volatile memory device of FIG. 1 and a memory controller, according to an exemplary embodiment.

FIG. 17 is a flowchart of an operation of the non-volatile memory device 30 of FIG. 1, and FIG. 18 is a block diagram of a system 300 including the non-volatile memory device 30 illustrated in FIG. 1 and the memory controller 310, according to an embodiment of the present invention.

Referring to FIGS. 1 through 18, the non-volatile memory device 30 may perform a set data/reset data simultaneous-program operation according to a command CMD output from the memory controller 310.

In operation S310, the non-volatile memory device 30 generates the set pulse PSET according to the command CMD. In operation S310, the set pulse generator 65-1 may sequentially generate the first through k-th pulses S_PUL<1> through S_PUL<k> that constitute the set pulse PSET as illustrated in FIG. 10, in response to the enable signal EN and the clock signal ICLK. The memory 65-2 may generate the selection signals SEL based on information stored (or set) in the memory 65-2. The selector 65-3 outputs one of the first through k-th pulses S_PUL<1> through S_PUL<k> as the pulse PSEL based on the selection signals SEL. In operation S320, the reset pulse generator 65-4 generates the reset pulse PRST in response to the pulse PSEL output from the selector 65-3 after programmed delay, namely, according to the information stored (or set) in the memory 65-2.

Figure 19:
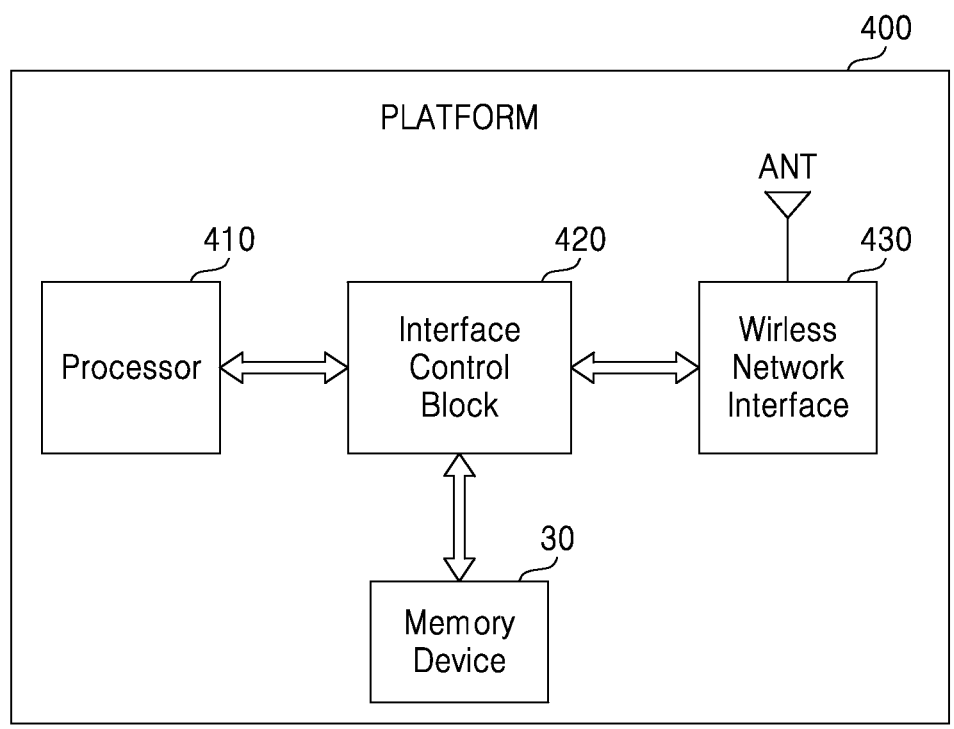
FIG. 19 is a block diagram of a computer platform including the non-volatile memory device of FIG. 1, according to an exemplary embodiment.

FIG. 19 illustrates a computer platform 400 including the non-volatile memory device 30 of FIG. 1, according to an exemplary embodiment. The computer platform 400 may be used in an electronic device such as a computing system. The electronic device may be a personal computer (PC) or a portable device, for example. The portable device may be implemented using a laptop computer, a mobile telephone, a smart phone, a tablet PC, a personal digital assistant (PDA), an enterprise digital assistant (EDA), a digital still camera, a digital video camera, a portable multimedia player (PMP), a personal (or portable) navigation device (PND), a handheld game console, an e-book, or the like.

The computer platform 400 includes a processor (or CPU) 410, an interface control block 420, the non-volatile memory device 30, and a wireless network interface 430. The computer platform 400 may be implemented using a system on chip (SoC).

The processor 410 communicates with the non-volatile memory device 30 or the wireless network interface 430 via the interface control block 420. The interface control block 420 includes one or more circuit blocks capable of performing various interface control functions. The interface control functions may include control of access to the non-volatile memory device 30, graphic control, input/output interface control, wireless network access control, and/or the like. Each of the circuit blocks may be implemented using an independent chip, as a part of the processor 410, or in the processor 410.

The non-volatile memory device 30 transmits data to and/or receives data from the processor 410 via the interface control block 420. A command capable of controlling an operation of the non-volatile memory device 30, for example, a set data/reset data simultaneous-program operation, may be output from the processor 410 or the interface control block 420. The wireless network interface 430 connects the computer platform 400 to a wireless network, for example, a mobile communication network or a wireless local area network (LAN), via an antenna ANT.

FIG. 20 is a block diagram of a three-dimensional non-volatile memory device 30A, according to an exemplary embodiment. Referring to FIGS. 1 through 20, the structure of the three-dimensional non-volatile memory device 30A of FIG. 20 is substantially the same as that of the non-volatile memory device 30 of FIG. 2, except for a plurality of layers Layer 1 through Layer s (where s denotes a natural number). Each of the layers Layer 1 through Layer s includes two-dimensionally arranged word lines, two-dimensionally arranged bit lines, and two-dimensionally arranged non-volatile memory cells MC.

The column selection circuit 60 controls the connection between each of the bit lines installed on one of the layers Layer 1 through Layer s and the write driver & S/A block 70, according to selection signals output from the column decoder 55. Each write driver included in the write driver & S/A block 70 may generate the set current ISET or the reset current IRST in response to the set bias signal PWD_SET, the reset bias signal PWD_RST, the set pulse PSET, and the reset pulse PRST. In FIG. 20, BL denotes a bit line, and WL denotes a word line.

As described above, the non-volatile memory device 30 or 30A according to embodiments of the present invention may adjust an activation point of time (or a deactivation point of time) of the reset pulse PRST using the selection signals SEL, thereby improving RWW noise. In addition, the non-volatile memory device 30 or 30A according to embodiments of the present invention may control a deactivation point of time of the switching signal LY1 based on the second set pulse control signal PSET_done or the reset pulse control signal PRST_done.

The selection signals SELR and SEL capable of selecting programmed delay may be set in a manufacturing stage of the non-volatile memory device 30 or 30A. The selection signals SELR and SEL may be set by a memory controller or a host (for example, a processor).

A non-volatile memory device according to exemplary embodiments may generate a set pulse and then generate a reset pulse using the set pulse after programmed delay, during a set data/reset data simultaneous-program operation. Moreover, the non-volatile memory device may simultaneously block a path for programming set data and a path for programming reset data in response to deactivation of one of the set pulse and the reset pulse.

While the inventive concept has been described with reference to illustrative embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A method of operating a non-volatile memory device comprising:
    generating a set pulse for writing first data to a first memory cell; and
    generating a reset pulse based on the set pulse after programmed delay for writing second data to a second memory cell.

2. The method of claim 1, wherein the programmed delay is determined based on information set in a programmable memory.

3. The method of claim 2, wherein the programmed delay is determined based on whether each fuse of the programmable memory is cut.

4. The method of claim 1, wherein the reset pulse is generated when the set pulse is activated.

5. The method of claim 1, wherein the reset pulse is generated when the set pulse is deactivated.

6. The method of claim 1, wherein the reset pulse is generated such that the reset pulse is deactivated when the set pulse is deactivated.

7. A method of operating a non-volatile memory device comprising:
    generating a set pulse; and
    generating a reset pulse based on the set pulse after programmed delay,
    wherein the reset pulse is generated such that a duration of the reset pulse exists within a duration of the set pulse.

8. The method of claim 1, wherein the set pulse comprises a plurality of pulses having overlapping durations, and wherein the reset pulse is generated based on one pulse of the plurality of pulses.

9. The method of claim 8, further comprising:
    selecting and outputting the one pulse of the plurality of pulses in response to selection signals corresponding to the programmed delay.

10. The method of claim 7, further comprising:
    substantially simultaneously programming second data to a second non-volatile memory cell using the reset pulse and first data to a first non-volatile memory cell using the set pulse.

11. The method of claim 1, further comprising:
    writing the second data corresponding to the reset pulse to the second memory cell using a second switching circuit that operates in response to a switching signal, while writing the first data corresponding to the set pulse to the first memory cell using a first switching circuit that operates in response to the switching signal,
    wherein the switching signal is deactivated in response to deactivation of one of the set pulse and the reset pulse.

12. A method of operating a non-volatile memory device, the method comprising:
    generating a reset pulse based on a set pulse;
    providing a reset signal generated according to the reset pulse to a second non-volatile memory cell, while providing a set signal generated according to the set pulse to a first non-volatile memory cell; and
    simultaneously blocking the set signal from being supplied to the first non-volatile memory cell and the reset signal from being supplied to the second non-volatile memory cell, in response to deactivation of one of the set pulse and the reset pulse.

* * * * *